United States Patent [19]

Bohnert et al.

[11] Patent Number: 5,053,694
[45] Date of Patent: Oct. 1, 1991

[54] DEVICE FOR MEASURING AN ELECTRIC FIELD

[75] Inventors: Klaus Bohnert, Niederrohrdorf; Jürgen Nehring, Wettingen, both of Switzerland

[73] Assignee: Asea Brown Boveri, Ltd., Baden, Switzerland

[21] Appl. No.: 502,339

[22] Filed: Mar. 30, 1990

[30] Foreign Application Priority Data

Apr. 7, 1989 [CH] Switzerland ............... 1311/89

[51] Int. Cl.$^5$ ............................................. G01R 19/00
[52] U.S. Cl. ..................................... 324/96; 324/72; 250/227.14
[58] Field of Search ................ 324/72, 96, 244; 310/313 A, 318, 319; 350/96.11, 96.13, 96.16; 250/227.14

[56] References Cited

U.S. PATENT DOCUMENTS

| | | | |
|---|---|---|---|
| 4,341,974 | 7/1982 | Calderara | 310/329 |
| 4,477,723 | 10/1984 | Carome et al. | 324/96 |
| 4,524,322 | 6/1985 | Bobb | 324/96 |
| 4,533,829 | 8/1985 | Miceli et al. | |
| 4,595,876 | 6/1986 | Kuhara et al. | 324/96 |
| 4,644,273 | 2/1987 | Bobb | 324/96 |
| 4,724,316 | 2/1988 | Morton | 250/227.14 |
| 4,929,830 | 5/1990 | Bohnert et al. | 324/96 |
| 4,939,447 | 7/1990 | Bohnert et al. | 324/96 |

FOREIGN PATENT DOCUMENTS 2052053 1/1981 United Kingdom .

OTHER PUBLICATIONS

Applied Optics, vol. 27, No. 23, Dec. 1, 1988 (New York, U.S.), K. M. Bohnert et al.: "Fiber-optic sensing of electric field components", pp. 4814–4818.
IBM J. Res. Develop., Precision Optical Measurement, vol. 17, No. 6, Nov. 1973, M. Kallmeyer et al.: "Rapid, precise, computer-controlled measurement of X–Y coordinates", pp. 490–499.
Applied Physics Letter, vol. 50, No. 25, Jun. 22, 1987 (New York, U.S.), Y. H. Lo et al.: "Proposal for three-dimensional internal field mapping by cw electro-optic probing", pp. 1791–1793.
"Use of highly elliptical core fibers for two-mode fiber devices", B. Y. Kim et al., Optics Letter, vol. 12, No. 9, p. 729 et seq., 12/1987.
Swiss Patent Application, No. CH-1628/88-2, May 2, 1988.
"Fiber-optic Fabry-Perot Interferometer and its Sensor Application", T. Yoshino et al., IEEE of Quant. Electr. QE-18, p. 1624, 12/1982.
"Electric Field Sensitive Optical Fibre Using Piezoelectric Polymer Coating", L. J. Donalds et al., Electr. Lett 18, p. 327, 12/1982.
Strain effects on highly elliptical core two-mode fibers: J. N. Blake et al., Optics Letters; vol. 12, No. 9, p. 732 et seq., 12/1987.

Primary Examiner—Kenneth Wieder
Assistant Examiner—William J. Burns
Attorney, Agent, or Firm—Oblon, Spivak, McClelland, Maier & Neustadt

[57] ABSTRACT

A device for measuring an electric field comprises three optical fiber sensors, which each have a piezoelectric sensor element, as well as an interferometer for generating a sensor signal. The optical fiber sensors have piezoelectric sensor elements that exclusively detect with the aid of the inverse piezoelectric effect a predetermined directional component, assigned in each case, of the electric field. The directional components of the different sensor elements are each aligned perpendicular to one another. An evaluation circuit determines the absolute value and direction of the electric field from the sensor signals generated.

The sensor elements are preferably formed by a single piezoelectric body, on whose faces the sensor fibers are fixed.

8 Claims, 3 Drawing Sheets

DEVICE FOR MEASURING AN ELECTRIC FIELD

BACKGROUND OF THE INVENTION

1. Field of the Invention

The invention concerns a device for measuring an electric field comprising at least one optical fiber sensor which has at least one piezoelectric sensor element that detects with the aid of the inverse piezoelectric effect a predetermined directional component, assigned to it, of the electric field, as well as first means that generate a sensor signal corresponding in each case to the assigned directional component.

2. Discussion of Background

Conventional optical and optical fiber sensors for measuring electric fields are based predominantly on electrooptic effects (Pockels effect, Kerr effect). Optical fiber sensors based on the inverse piezo effect have recently been developed. These known sensors generate a signal which is proportional to the field strength. However, with the known optical fiber sensors it is not possible simultaneously to detect the direction and absolute value of an electric field. Rather, the field direction must be known in advance, so that the field strength can be determined.

A short while ago, an optical fiber sensor was disclosed (e.g. Swiss Patent Application CH-1628/88-2), which exclusively detects a predetermined directional component of the field. The directional component is determined by the shape and the design of the sensor, and easily recognizable at the sensor (e.g. surface normal of a disk-shaped sensor wafer).

Optical fiber sensors have the basic advantage that they are insensitive to electrical and magnetic disturbances. Moreover, because of their insulating properties they can be used in the presence of large electric voltages without any problems. Today, the interferometric detection needed with optical fiber sensors is at a high technical level. This is illustrated by the following list of relevant printed publications:

"Fiber-optic Fabry-Perot Interferometer and its Sensor Application", T. Yoshino et.al. IEEE J. of Quant. Electr. QU-18, page 1624, 1982, "Electric Field Sensitive Optical Fibre Using Piezoelectric Polymer Coating)", L. J. Donalds et.al. Electr. Lett 18, page 327, 1982, "Strain effects on highly elliptical core two-mode fibers", J. N. Blake et.al., Optics Letters Vol. 12 No. 9, page 732 et seq., 1987, "Use of highly elliptical core fibers for two-mode fiber devices", B. Y. Kim et.al., Optics Letters Vol. 12 No. 9, page 729 et seq., 1987.

SUMMARY OF THE INVENTION

Accordingly, one object of this invention is to provide a novel device for measuring an electric field, which simultaneously determines the absolute value and direction of the fiel using optical fiber.

According to the invention the solution consists in that at least two optical filler sensors are provided for measuring the absolute value and direction of the electric field, the directional components assigned to the piezoelectric sensor elements being aligned perpendicular to one another in each case, and in that second means are provided which determine the absolute value and direction of the electric field from the sensor signals generated.

The core of the invention resides in that symmetry properties of the inverse piezoelectric effect are utilized in such a way that the field components in, e.g., three mutually perpendicular directions in space can be detected independently of one another. The absolute value and direction of the acting field are then determined by computation from the three detected field components.

In order to measure a directional component in isolation, a glass fiber is fixed to a suitable piezoelectric material in such a way that only one of the three field components causes a change in dimension of the glass fiber. A change in length induced in this way in the glass fiber is directly proportional to the electric field, and is measured interferometrically and evaluated electronically.

There are basically two variant embodiments, that is to say one with a plurality of independent piezoelectric bodies mounted on a substrate, and one with a single cuboid body.

In accordance with a particularly preferred embodiment, all directional components are detected with a single sensor crystal. The sensor crystal is cuboid or cube-shaped, and consists of a material of one of the crystal classes, T, $T_d$, $T_2$, $D_{2d}$, i.e., it has three 2-fold crystallographic axes of rotation. These are oriented parallel to its edges. Sensor fibers are fixed in each case to faces aligned perpendicular to one another. The at least two sensor elements are thus formed by faces of the cuboid, piezoelectric body which are perpendicular to one another.

In the case of the..variant embodiment with a plurality of independent sensor crystals, it is preferred to mount on a substrate three sensor elements, such as are described, e.g. in the Patent. Application CH-1628/88-2 quoted at the beginning, which are aligned with the assigned directional component perpendicular to one another. The sensor elements have, e.g., the shape of a round disk or of a platelet.

The interferometric means comprise, e.g., Mach-Zehnder interferometer, optical fiber Fabry-Perot interferometers, two-mode interferometers and the like.

A large number of preferred embodiments emerge from the dependent patent claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
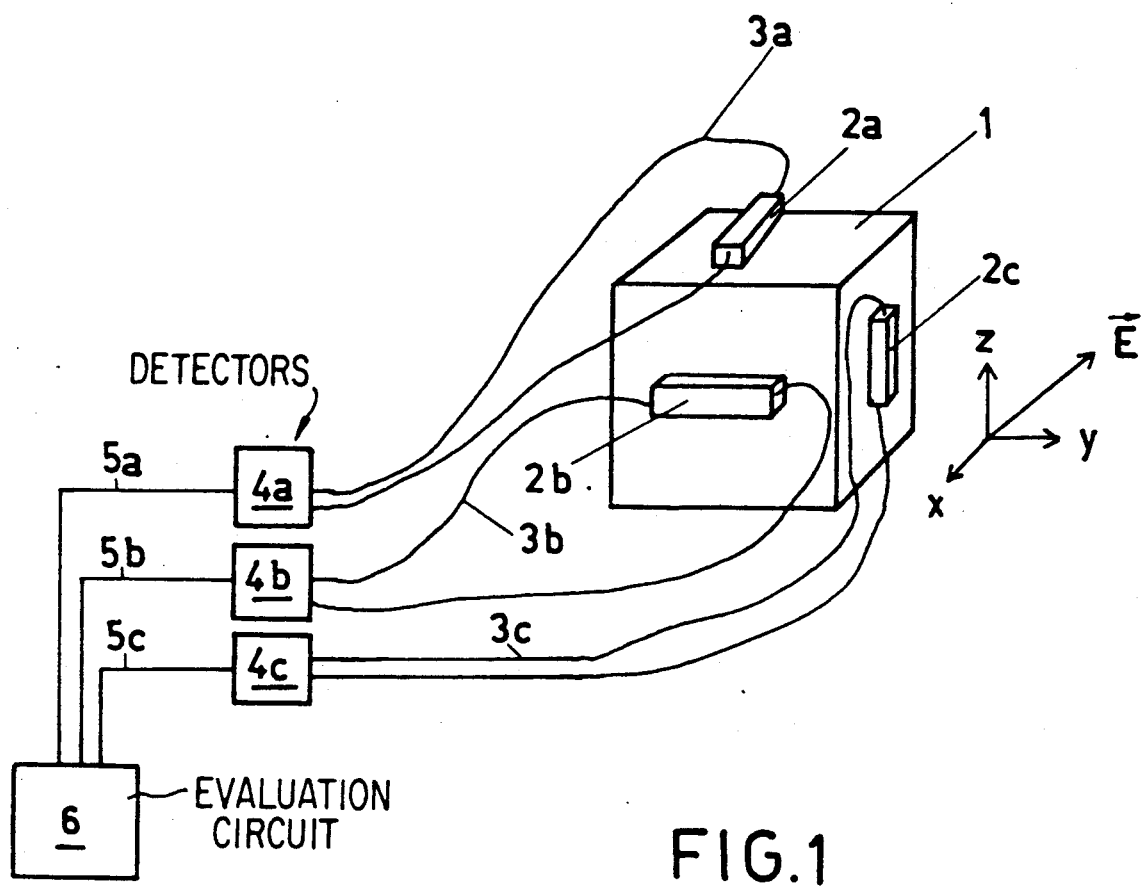
FIG. 1 shows, a diagrammatic representation of a device for measuring the absolute value and direction of an electric field.

The reference numerals employed in the drawing are compiled in a table together with their significance in the list of designations.

DESCRIPTION OF THE PREFERRED EMBODIMENTS

Referring now to the drawings, wherein like reference numerals designate identical or corresponding parts throughout the several views, FIG. 1 shows a diagrammatic representation of a device according to the invention for simultaneous measurement of the absolute value and direction of an electric field E.

Mounted on a substrate 1, e.g. a cuboid or cube-shaped and non-piezoelectric: body, are three piezoelectric sensor elements 2a, 2b, 2c. Each of the three sensor elements 2a, 2b, 2c is constructed so that it is sensitive only to a predetermined directional component of the electric field E assigned to it. In turn, the piezoelectric sensor elements 2a, 2b, 2c are arranged on the substrate 1 so that the three directional components are aligned in pairs perpendicular to one another.

A sensor fiber 2a, 3b, 3c, having a given section of length in each case, is fixed to each sensor element 2a, 2b, 2c. Each sensor fiber 2a, 3b, 3c is connected to a detector 4a, 4b, 4c. Each of the three detectors 4a, 4b, 4c interferometrically detects a change in length brought about by the piezoelectric sensor element 2a, 2b, 2c (in accordance with the field components of the acting electric field E), and generates a corresponding output signal. The latter is passed on in each case to an evaluation circuit 6 via a detector output 5a, 5b, 5c.

The evaluation circuit 6 determines the absolute value and direction of the electric field E from the sensor signals, and exhibits said amount and direction in the desired fashion, for example on a display. Depending upon the field of application, the quantities determined (absolute value, direction) can also be passed on to a monitoring station via a bus connection (not shown in FIG. 1) customary in control engineering.

The optical fiber sensor and piezoelectric sensor element will now be described below. Basically, the means provided for measuring a specific directional component are analogously constructed for all three directions in space. Thus, what is said for the sensor element 2a, e.g., applies correspondingly to the other two sensor elements 2b and 2c.

Figure 2:
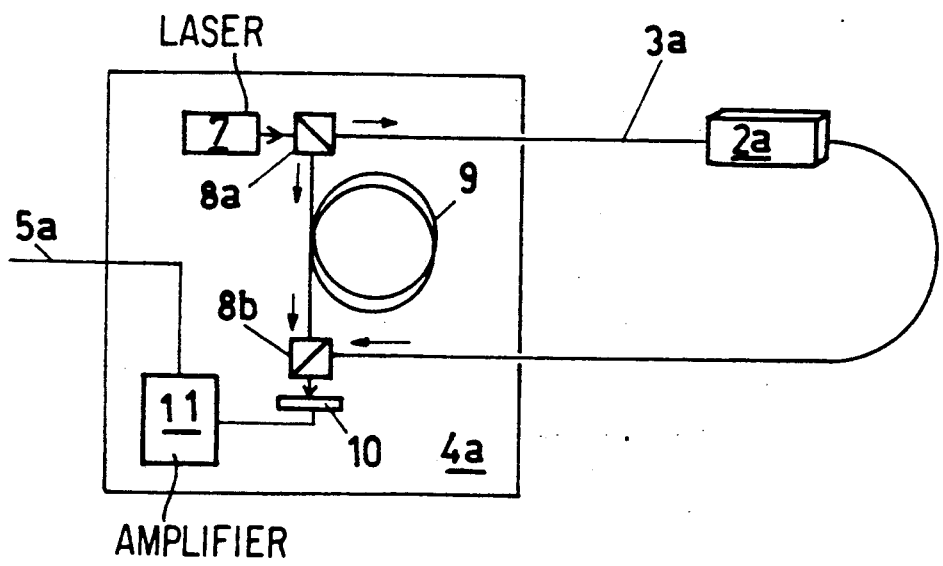
FIG. 2 shows a diagrammatic representation of an optical fiber sensor.

FIG. 2 shows a diagrammatic representation of an optical fiber sensor for measuring a predetermined directional component of the electric field E. It comprises, inter alia, the following parts already indicated in FIG. 1: piezoelectric sensor element 2a, sensor fiber 2a, and detector 4a. A Mach-Zehnder arrangement serves as the interferometric means for detecting a change in length of the sensor fiber 3a.

The Mach-Zehnder interferometer, which is known per se, is particularly advantageous because of its high sensitivity. However, it in no way represents the only possible embodiment.

A laser 7 generates a sufficiently coherent beam, which is subdivided in a first beam splitter 8a into two component beams. One of the component beams is coupled into the sensor fiber 2a, and upon the application of an electric field in the sensor element 2a experiences a phase shift which is proportional to the strength of the predetermined directional component of the electric field E. The second component beam is coupled into a reference fiber 9.

The two component beams from sensor fiber 3a and L 20 reference fiber 9 are united in a second beam splitter 8b to form an interference beam, which is then collected by a photodetector 10. An amplifier 11 generates from the photoelectric current of the photodetector 10 an output signal which is proportional to the intensity of the interference beam.

As has already been said, the optical fiber Mach-Zehnder arrangement is known per se. Here, therefore, the detector does not require any detailed explanation.

A directionally sensitive piezoelectric sensor element has already been revealed as such in the Patent Application CH-1628/88-2 quoted at the beginning. However, for the sake of completeness some advantageous embodiments of the sensor element 2a are described below.

Figures 3, 4:
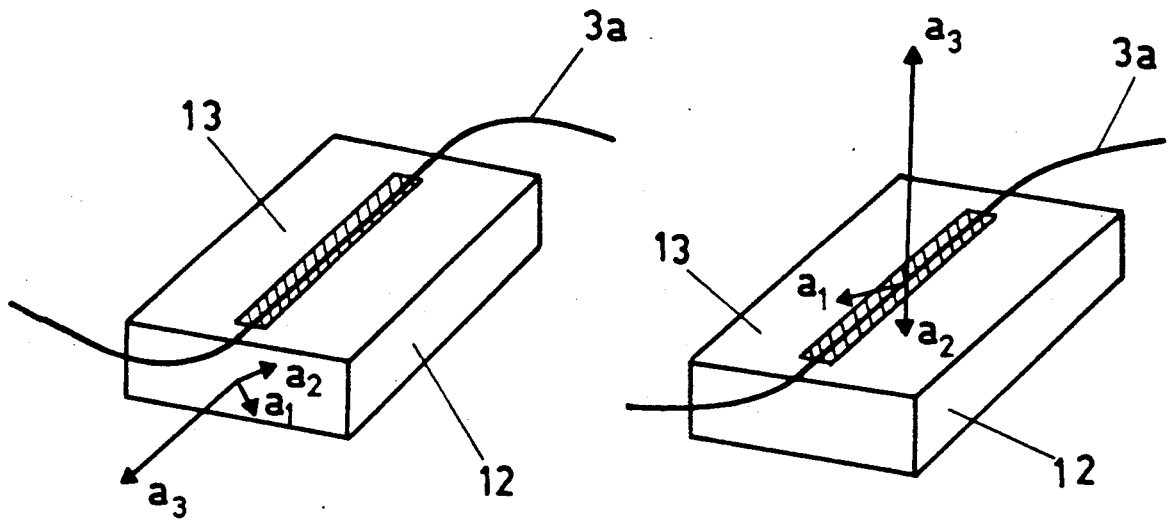
FIG. 3 shows a piezoelectric sensor element, which exclusively detects a directional component of the electric field parallel to the glass fiber.
FIG. 4 shows a piezoelectric sensor element, which exclusively detects a directional component of the electric field perpendicular to the glass fiber.

FIG. 3 shows a sensor element which detects a predetermined directional component parallel to the sensor fiber 3a. The sensor fiber 3a is fixed with a given section of length (see hatched area) on a main face 13 of a piezoelectric body 12. The body 12 has, e.g., the shape of a platelet and has a specific crystallographic orientation, which is defined by three orthogonal axes $a_1$, $a_2$, $a_3$. The axis $a_3$ denotes the direction in space in which the sensor element is sensitive. This means that only one directional component, parallel to the axis $a_3$, of the electric field can lead to a sensor signal. The precondition for this is that one of the conditions set forth in Table I is fulfilled:

TABLE 1

| Crystal classes (Schoenflies [international]) | | Axis of rotation parallel to the glass fiber |
|---|---|---|
| C2 | [2] | 2-fold axis |
| C2v | [2mm] | 2-fold axis |
| C3 | [3] | 3-fold axis |
| C3v | [3m] | 3-fold axis |
| D3 | [32] | 2-fold axis |
| D3h | [62m] | 2-fold axis |
| C4 | [4] | 4-fold axis |
| C6 | [6] | 6-fold axis |
| C∞ | [∞] | ∞-fold axis |
| C4v | [4mm] | 4-fold axis |
| C6v | [6mm] | 6-fold axis |
| C∞v | [∞mm] | ∞-fold axis |
| T | [23] | 3-fold axis |
| Td | [43m] | 3-fold axis |

The left-hand column of the table sets forth the crystal classes (in Schoenflies and international notation, respectively) for which the embodiment in accordance with FIG. 3 is suitable, and the right-hand column indicates which crystallic graphic axis of rotation of a body belonging to the corresponding crystal class must run essentially parallel to the axis $a_3$, i.e. parallel to the sensor fiber.

There are no further restricting conditions relating to the axes $a_1$ and $a_2$ in the case of the embodiments in accordance with FIG. 3.

If, now, piezoelectric sensor elements in accordance with FIG. 3 are employed in the device shown in FIG. 1, and said sensor elements are aligned in each case parallel to one of the three edges of the cuboid substrate 1 which emanate from a corner point, the sensor element 2a detects the directional component in the x-direction, the sensor element 2b that in the y-direction and the sensor element 2c that in the z-direction. The coordinate system x, y, z (see FIG. 1) is thus defined by three mutually orthogonal edges of the substrate 1.

FIG. 4 shows a further class of sensor element. Here, the predetermined directional component is perpendicular to the sensor fiber 3a. For the sake of simplicity, the piezoelectric body 12 has the shape of a platelet here, as well. As in FIG. 3 the sensor fiber 3a is fixed with a given section of length on a main face 13 of the body 12.

The crystallographic orientation differs from that of the embodiment shown in FIG. 3. The axis $a_3$ is perpendicular to the main face 13. The other two axes $a_1$ and $a_2$ are preferably aligned so that they enclose an angle of 45° with the sensor fiber 3a. In other words: the sensor fiber 3a lies on a bisector of the two axes $a_1$ and $a_2$. The conditions for the crystallographic orientation are summarized in Table II.

TABLE II

| Crystal classes Schoenflies [international]) | Axis of rotation ∥ or ⊥ for the predetermined directional component | Direction of the sensor fiber for maximum elongation |
| --- | --- | --- |
| D2 [222] | ∥ 2-fold axis | 45° in relation to 2-fold axis |
| D2d [$\bar{4}$2m] | ∥ 2-fold axis | 45° in relation to 2-fold axis |
| T [23] | ∥ 2-fold axis | 45° in relation to 2-fold axis |
| Td [$\bar{4}$3m] | ∥ $\bar{4}$-fold axis | 45° in relation to $\bar{4}$-fold axis |
| D4 [422] | ⊥ 4-fold axis | 45° in relation to 4-fold axis |
| D6 [622] | ⊥ 6-fold axis | 45° in relation to 6-fold axis |
| D∞ [∞22] | ⊥ ∞-fold axis | 45° in relation to ∞-fold axis |

The first two columns of Table II give some possible crystal classes (in Scloenflies and international notation, respectively), which are suitable for the embodiment in accordance with FIG. 4. The third column indicates which crystallographic axis of rotation must run parallel or perpendicular to the axis $a_3$. The fourth column indicates how the sensor fiber 3a must be aligned with respect to a specific axis of rotation in order to receive a maximum sensor signal for a given field strength. Thus, other alignments of the sensor fiber 3a are not inadmissible, for example, but lead only to a slight elongation of the sensor fiber. The reason for this is that the inverse piezoelectric effect induces a shear of the platelet about one axis perpendicular to the main face, and that for a suitable alignment of the glass fiber this shear leads to a maximum change in length of said glass fiber.

If sensor elements in accordance with FIG. 4 are employed in the device in accordance with FIG. 1, the main face 13 of each piezoelectric body 12 being directed in each case parallel to the corresponding face of the substrate 1, each sensor element 2a, 2b, 2c detects a directional component of the electric field E which is perpendicular to the face of the substrate 1 on which it is fixed. Thus, the coordinate system spanning space is defined by three orthogonal surface normals of the substrate 1. Platelet-shaped sensor elements therefore do not need to be aligned parallel to an edge of the substrate 1.

As has already been said, there is still a large number of further embodiments for the piezoelectric sensor elements It should suffice at this juncture to refer once more expressly to the Patent Application CH-1628/88-2.

The next step is a detailed explanation of the evaluation circuit 6. It is assumed without restriction of generality that the sensor signals corresponding to the directional component of the field in x-, y- and z-direction occur respectively at the detector outputs 5a, 5b, and 5c (see FIG. 1).

In the evaluation circuit, the first step is to multiply the sensor signals by suitable weights $w_x$, $W_y$, $W_z$. It is possible in this way to compensate a different sensitivity of the three optical fiber sensors.

The next step is for each of the three weighted sensor signals to be evaluated respectively in a compensator 14a, 14b, 14c and to be converted respectively into a digital signal $E_x$, $E_y$, $E_z$ which reproduces the magnitude of the particular directional component of the electric field. The compensators 14a, 14b, 14c take account, on the one hand, of any non-linearities of the interferometric arrangement (dependency of the intensity of the interference beam on the phase shift of the component beam) and, on the other hand, of the linear relationship, dictated by the piezoelectric coefficients, between field strength and relative change in length of the sensor fiber.

A computer 15 calculates absolute value |and direction, defined by the angles $\phi$ and $\theta$, from the digital signals $E_x$, $E_y$, $E_z$, and outputs them, e.g., on a display.

Figure 6:
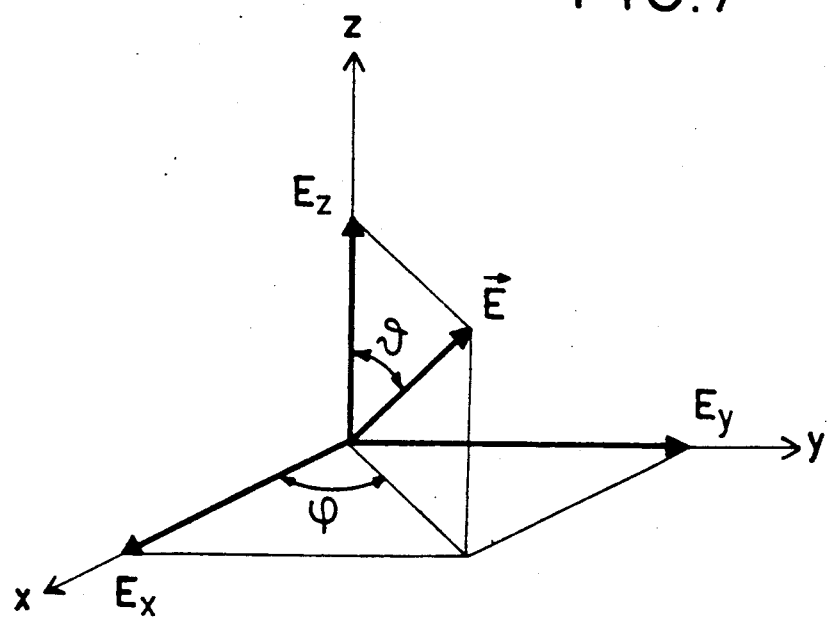
FIG. 6 shows a representation of the spatial relationships which are used in evaluating the sensor signals.

FIG. 6 illustrates the spatial relationships which are used in the evaluation on that computer 15. The basis is a coordinate system x, y, z, as is generated by the directional components given by the sensor elements 2a, 2b, 2c in accordance with FIG. 1. If the components of the electric field are given by the digital signals $E_x$, $E_y$, $E_z$, the absolute value | of the field strength is given, as is known, by:

$$|E| = \sqrt{E_x^2 + E_y^2 + E_z^2} \quad (I)$$

In order to determine the direction of the electric field it is also necessary to consider the signs of the directional components. If the electric field has a sinusoidal secular variation, the information on the signs is contained in the phase angle of the sensor signals, which is either 0° or 180°. It is, or course, advantageous if the sensors are configured so that in the case of a positive directional component they all also deliver a positive sensor signal (positive sign) in each case. This is an arrangement which facilitates the realization of the evaluation circuit. However, it is in no way of fundamental importance.

If the angle $\theta$ denotes the angle enclosed by the field E with the z-direction, and the angle $\phi$ that enclosed between a normal projection of the field E onto the x-y plane and the x-direction (see FIG. 6), the following relationships hold:

$$\phi = \arctan (E_y/E_x) \quad \text{if } E_x \text{ is positive} \quad (II)$$

$$\phi = \arctan (E_y/E_x) + 180° \quad \text{if } E_x \text{ is negative} \quad (III)$$

$$\theta = \arctan (\sqrt{E_x^2 + E_y^2}/E_z) \quad \text{if } E_z \text{ is positive} \quad (IV)$$

$$\theta = \arctan (\sqrt{E_x^2 + E_y^2}/E_z) + 180° \quad \text{if } E_z \text{ is negative} \quad (V)$$

These mathematical operations are evaluated in the computer 15, e.g. a microprocessor known per se.

A further, particularly preferred embodiment of the invention is described below. In this case, all three directional components are detected by a single piezoelectric body.

Figure 7:
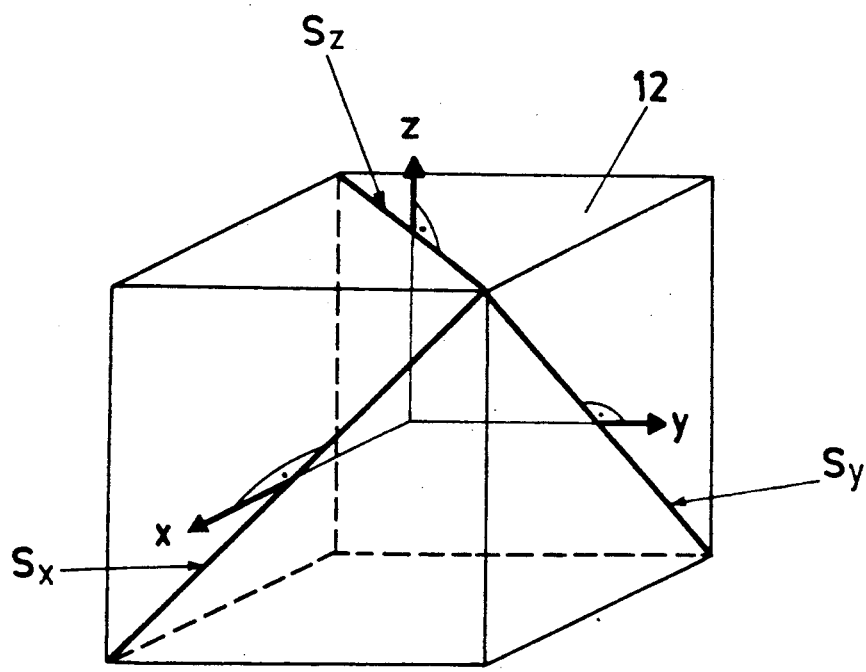
FIG. 7 shows a diagrammatic representation of a preferred embodiment of the invention, in which three field components are detected with a single sensor crystal.

FIG. 7 shows a corresponding sensor element with a cube-shaped piezoelectric body, 12. This consists of a material which belongs to one of the four crystal classes T, $T_d$, $T_2$ and $D_{2d}$. The crystallographic orientation is such that the three edges emanating from a corner of the piezoelectric body 12 each run parallel to a two-fold axis of rotation. In this way, the directional components of the electric field lead to a shear of the face, respectively perpendicular thereto, of the cube-shaped body 12. The predetermined directional components are thus perpendicular to the corresponding faces, and define a coordinate system x, y, z in a manner analogous to the embodiment in accordance with FIG. 1 in conjunction with FIG. 4.

The sensor fibers 3a, 3b, 3c are now preferably fixed on a face diagonal on the piezoelectric body 12. This results in a maximum sensitivity To be precise, the relative change in length $\delta L/L$ of the sensor fiber is a maximum, on the one hand, while the total change in length on the face diagonal (fixed section of length x relative change in length) is naturally also a maximum, on the other hand.

In concrete terms, this means that in FIG. 7 the sensor fiber 3a runs on a face diagonal $s_x$ and thus detects a directional component in the x-direction, the sensor fiber 3b runs on a face diagonal $s_y$ and thus detects a directional component in the y-direction, and the sensor fiber 3c runs on a face diagonal $s_z$ and thus detects a directional component in the z-direction.

Figure 5:
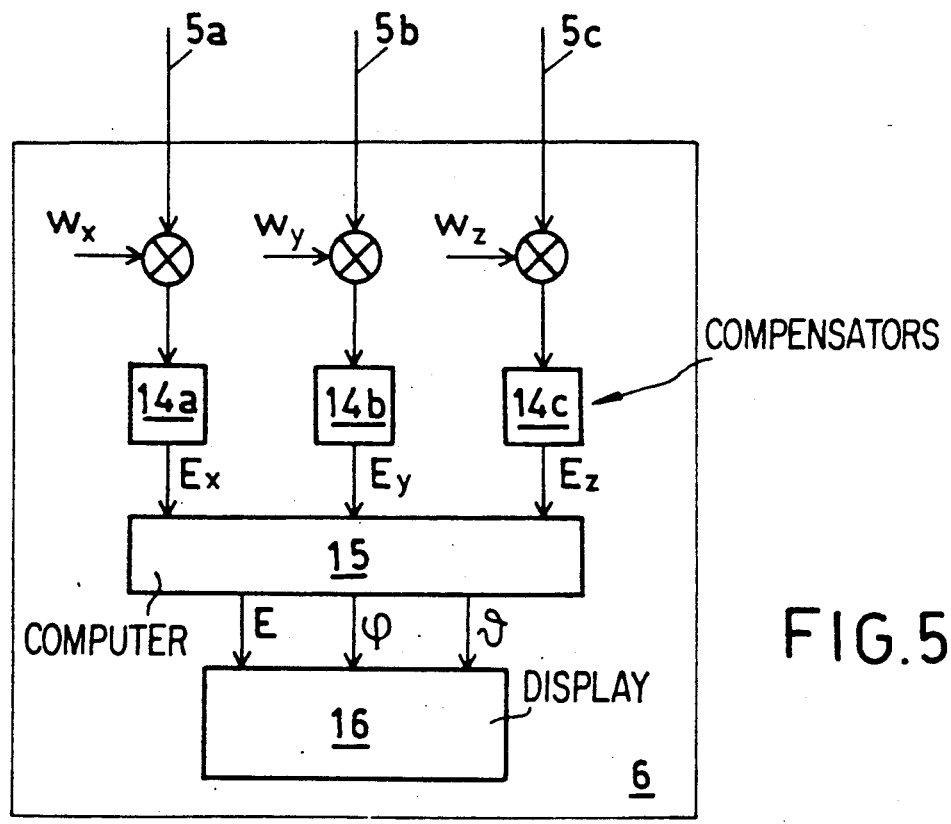
FIG. 5 shows a circuit arrangement for evaluating the sensor signals.

It goes without saying that separate interferometric means are provided for each of the three sensor fibers 2a, 3b, 3c, and that the evaluation is done in a manner analogous to FIG. 1 in conjunction with FIG. 5.

In the present example, the normal projection of the face diagonal $s_x$ onto the y-z plane forms the positive bisector (bisector of quadrants I and III in a coordinate system set up by the y- and z-direction). A corresponding statement holds for the other two face diagonals $s_y$ and $s_z$. As a result of such an alignment, a phase angle of the sensor signal of 180° exhibits a negative sign for all directional components, if the corresponding piezoelectric coefficients of expansion $d_{ij}$ are positive. If the corresponding coefficients of expansion are negative, the abovementioned relationship is simply inverted.

For the crystal classes T and $T_d$, the phase angle (in the case of the positive bisector) is always the same for all three directional components, but can take the values 0° or 180°, depending upon whether the coefficients of expansion $d_{ij}$ are positive or negative. For the crystal classes $D_2$ and $D_{2d}$, the phase angle of the three sensor signals is equal only if all coefficients of expansion $d_{ij}$ have the same sign, but this need not be the case on grounds of symmetry.

Of course, the face diagonals $s_x$, $s_y$, $s_z$ can equally well run in the direction of the negative bisector (bisector of quadrants II and IV). This entails simply inverting the relationship described above between sign and phase angle.

As has already been indicated, the sensor fibers 3a, 3b, 3c are not categorically required to be mounted on a face diagonal on the piezoelectric body. They can also perfectly well run in another direction. Then, of course, the relative change in length $\delta L/L$, which is induced due to the inverse piezoelectric effect, is smaller (for the same electric field strength). Thus, it is also clear that instead of being cube-shaped, the piezoelectric body 12 may also be cuboid.

If, however, the sensor fibers run on the face diagonals in the case of a cuboid body, the result in general is a different sensitivity for the various directional components. To be precise, it follows from the explanations above that an electric field of given strength in the x-direction does not lead to a sensor signal of the same size as does an electric field of the same strength in the y-direction. This different sensitivity can, e.g., be compensated with suitable weights $w_x$, $W_y$, $W_z$ in the evaluation circuit 6.

The next step is to show how the relative change in length of the sensor fibers and, correspondingly, the sensor signal) depends upon the electric field.

The matrices of the piezoelectric coefficients of expansion are known to be as follows for the crystal classes T, $T_d$, $T_2$, $D_{2d}$:

$T, T_d$ $$\begin{bmatrix} 0 & 0 & 0 & d_{14} & 0 & 0 \\ 0 & 0 & 0 & 0 & d_{14} & 0 \\ 0 & 0 & 0 & 0 & 0 & d_{14} \end{bmatrix}$$

$D_{2d}$ $$\begin{bmatrix} 0 & 0 & 0 & d_{14} & 0 & 0 \\ 0 & 0 & 0 & 0 & d_{14} & 0 \\ 0 & 0 & 0 & 0 & 0 & d_{36} \end{bmatrix}$$

$D_2$ $$\begin{bmatrix} 0 & 0 & 0 & d_{14} & 0 & 0 \\ 0 & 0 & 0 & 0 & d_{25} & 0 \\ 0 & 0 & 0 & 0 & 0 & d_{36} \end{bmatrix}$$

Thus, the particularly preferred embodiment with only one piezoelectric body is based on the fact that in the case of four abovementioned symmetry groups, only three shear movements are possible in each case with respect to three axes which are mutually perpendicular in each case. These axes are the two-fold crystallographic axes of rotation, in each case. Each of these shear movements is brought about exclusively by the field component parallel to the corresponding shear axis (crystal axis).

The relationship between electric field and relative change in length, which is dictated by the matrices of the piezoelectric coefficients of expansion, is adequately known. (The notation implied here for the crystallographic axis accords with the convention such as is described in, e.g., the book "Physical Properties of Crystals" J. F. Nye, Oxford University Press, 1967). As an example, it follows that for the crystal classes T and $T_d$ the following relationship holds between digital signal $E_x$ and relative change in length $\delta L/L$:

$$\delta L/L = d_{14} E_x \qquad (VI)$$

An analogous statement holds for the other directional components.

The embodiment with the cube-shaped piezoelectric body is particularly advantageous for materials of the crystal classes T and $T_d$, since all three directional components are measured with the same sensitivity. To be precise, the relevant coefficients of expansion are all of the same size.

As has already been said, it is possible to take appropriate account in the evaluation circuit of the different sensitivity of the directional components in the case of the crystal classes $D_2$, $D_{2d}$. Another possibility consists in that the direction in which the particular sensor fiber is fixed on the face of the piezoelectric body is chosen precisely so that the influence of the different coefficients of expansion is geometrically compensated.

Materials which are particularly well suited for the embodiment shown in FIG. 7 are, inter alia, the following:

T: Bismuth germanium oxide $Bi_{12}GeO_{20}$, sodium chlorate $NaClO_3$, ammonium sulfate $(NH_4)_2Mn_2(SO_4)_3$, potassium sulfate $K_2Mn_2(SO_4)_3$, rubidium sulfate $Rb_2Mn_2(SO_4)_3$, etc.

$T_d$: III-V compound semiconductors such as, e.g., GaAs, InAs, InP, ZnSe, GaP.

$D_2$: Rochelle salt $KNaC_4H_4O_6 \times 4H_2O$, iodic acid $HIO_3$ etc.

$D_{2d}$: potassium phosphate (potassium dihydrogen phosphate), ammonium phosphate (ammonium dihydrogen phosphate), rubidium phosphate (rubidium dihydrogen phosphate).

GaAs assumes a preferred position here, since the production technology is far advanced.

The invention is not, of course, restricted to the illustrative embodiments described. It also emerges from the following references to further embodiments The Mach-Zehnder interferometer can be operated to increase the measuring range, e.g., with compensation in the reference path as well. Likewise, means can also be provided for the heterodyne detection, if required.

Because of their higher resolution, Fabry-Perot interferometers are suitable instead of the Mach-Zehnder interferometer. In this case, the sensor fiber fixed on the piezoelectric body is constructed as an optical fiber Fabry-Perot interferometer whose transmission or reflection is measured.

Two-mode interferometers can also possibly be used. Here, the sensitivity of the interferometer, which is low per se, can be compensated by a section of length of the sensor fiber which is as large as possible and fixed to the piezoelectric body.

Of course, the sensitivity of the optical fiber sensor essentially depends upon how large is the section of length fixed on the body. In this regard, the face diagonal provides the maximum. However, since a cuboid body always possesses two faces which fully correspond to one another, each sensor fiber can be routed and fixed over two face diagonals. This alone doubles the sensitivity. A further increase results if the sensor fiber is multiply wound around the body, being fixed on the corresponding face in a plurality of sections of length which are parallel to one another.

In general, the sensor signal has a sinusoidal large-signal behavior. If the variation induced in the phase of the component beam by the inverse piezoelectric effect is located in the range of approximately $\pm 0.1$ rad then it is completely sufficient if the sinusoidal signal behavior in this range is replaced by a linear approximation. The consequence of this is that there is then a particularly simple embodiment of the compensators.

The evaluation circuit can be realized extremely simply if the sensor signals are digitized immediately at the inputs and all subsequent operations are carried out with a microprocessor known per se.

Although so far always three directional components have been mentioned, this does not mean that a "reduced" embodiment with only two directionally sensitive sensor elements is not covered by the invention. Likewise, redundant embodiments with more than three directional components can be realized in accordance with the invention.

Overall, the invention provides a very compact device which can be applied in a versatile fashion for simultaneously measuring the absolute amount and direction of an electric field.

Obviously, numerous modifications and variations of the present invention are possible in light of the above teachings. It is therefore to be understood that within the scope of the appended claims, the invention may be practiced otherwise than as specifically described herein.

| LIST OF DESIGNATIONS | |
|---|---|
| 1 | Substrate |
| 2a, 2b, 2c | Sensor element |
| 3a, 3b, 3c | Sensor fiber |
| 4a, 4b, 4c | Detector |
| 5a, 5b, 5c | Detector output |
| 6 | Evaluation circuit |
| 7 | Laser |
| 8a, 8b | Beam splitter |
| 9 | Reference fiber |
| 10 | Photodetector |
| 11 | Amplifier |
| 12 | Piezoelectric body |
| 13 | Main face |
| 14a, 14b, 14c | Compensator |
| 15 | Computer |
| 16 | Display |
| E | Electric field |
| $E_x, E_y, E_z$ | Digital signal |
| $a_1, a_2, a_3$ | Axes |
| $\phi, \theta$ | Angles |
| $w_x, w_y, w_z$ | Weight |

What is claimed as new and desired to be secured by Letters Patent of the U.S. is:

1. A device for measuring an electric field, comprising:
    a cuboid piezoelectric body having mutually perpendicular faces and consisting of a material of one of the crystal classes T, $T_d$, $D_2$, $D_{2d}$, and thus having three 2-fold crystallographic axes of rotation, said body aligned with its edges parallel to the 2-fold crystallographic axes of rotation;
    at least two optical fiber sensors for measuring the absolute value and directional components of the electric field, the directional components assigned to the sensor elements being aligned perpendicular to one another, in each case, each optical fiber sensor comprising,
    a sensor fiber fixed with a section of length to a respective of said mutually perpendicular faces of said cuboid piezoelectric body, and
    interferometric means for measuring a change in length of the sensor fiber induced by the inverse piezoelectric effect, so that the directional component sensed by said sensor fiber coincides with a surface normal in each case, and producing a sensor signal corresponding to the directional component; and means for determining the absolute value and direction of the electric field from the sensor signals produced by each said interferometric means.

2. The device as claimed in claim 1, wherein the piezoelectric body is cube-shaped.

3. The device as claimed in claim 1, wherein the sensor fiber is fixed parallel to a face diagonal of the piezoelectric body.

4. The device as claimed in claim 1, wherein the material is a III-V compound semiconductor.

5. The device as claimed in claim 1, wherein the material is a crystal from a group comprising GaAs, InAs, InP, ZnSe, GaP.

6. The device as claimed in claim 1, wherein the material is a crystal from a group comprising potassium dihydrogen phosphate, rubidium dihydrogen phosphate, ammonium dihydrogen phosphate.

7. The device as claimed in claim 1, wherein the interferometric means comprise a Mach-Zehnder interferometer.

8. The device as claimed in claim 1, wherein precisely three optical fiber sensors having mutually perpendicular sensor fibers in each case, are provided with the assigned directional components.

* * * * *